US008972907B1

(12) United States Patent
Yokoyama et al.

(10) Patent No.: US 8,972,907 B1
(45) Date of Patent: Mar. 3, 2015

(54) LAYOUT CORRECTING METHOD, RECORDING MEDIUM AND DESIGN LAYOUT CORRECTING APPARATUS

(71) Applicant: Kabushiki Kaisha Toshiba, Minato-ku (JP)

(72) Inventors: Yoko Yokoyama, Minato-ku (JP); Keishi Sakanushi, Fujisawa (JP); Chikaaki Kodama, Arakawa-ku (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/191,850

(22) Filed: Feb. 27, 2014

Related U.S. Application Data

(60) Provisional application No. 61/875,964, filed on Sep. 10, 2013.

(51) Int. Cl.
*G06F 17/50* (2006.01)
(52) U.S. Cl.
CPC .................... *G06F 17/5081* (2013.01)
USPC ............... 716/51; 716/50; 716/52; 716/55
(58) Field of Classification Search
CPC .............. G06F 17/5081; G06T 2207/30148; G06T 7/0004; G03F 7/705; G03F 1/00
USPC ........................... 716/50, 51, 52, 55
See application file for complete search history.

(56) References Cited

U.S. PATENT DOCUMENTS

| | | | |
|---|---|---|---|
| 4,985,927 A * | 1/1991 | Norwood et al. | 382/149 |
| 7,001,693 B2 * | 2/2006 | Liebmann et al. | 430/5 |
| 7,626,163 B2 * | 12/2009 | Honda | 250/306 |
| 7,927,770 B2 * | 4/2011 | Kanamitsu | 430/5 |
| 8,035,058 B2 * | 10/2011 | Nakasu et al. | 219/121.68 |
| 8,086,973 B2 | 12/2011 | Yoshida et al. | |
| 8,121,387 B2 * | 2/2012 | Asano et al. | 382/141 |
| 8,151,225 B2 | 4/2012 | Maeda | |
| 8,510,683 B2 * | 8/2013 | Peng et al. | 716/52 |
| 2005/0086618 A1 * | 4/2005 | Ito et al. | 716/4 |
| 2008/0232671 A1 * | 9/2008 | Asano et al. | 382/144 |
| 2009/0291512 A1 * | 11/2009 | Izuha et al. | 438/16 |
| 2011/0194751 A1 * | 8/2011 | Takimoto et al. | 382/144 |
| 2012/0198404 A1 * | 8/2012 | Hasebe | 716/112 |

FOREIGN PATENT DOCUMENTS

| | | |
|---|---|---|
| JP | 8-76348 | 3/1996 |
| JP | 10-334134 | 12/1998 |
| JP | 2007-286918 | 11/2007 |
| JP | 2008-158100 | 7/2008 |
| JP | 2010-139769 | 6/2010 |

* cited by examiner

*Primary Examiner* — Sun Lin
(74) *Attorney, Agent, or Firm* — Oblon, McClelland, Maier & Neustadt, L.L.P.

(57) ABSTRACT

In a design layout correcting method of an embodiment, a design layout of a circuit pattern is divided to a first mask pattern and a second mask pattern. The mask pattern of the pattern defect area of the first or second mask pattern is set as the correcting target pattern. A correcting target region and a verifying region are set within the first or second mask pattern. The correcting target pattern is corrected within the correcting target region, and the first and second mask patterns are verified within the verifying region.

20 Claims, 9 Drawing Sheets

LAYOUT CORRECTING METHOD, RECORDING MEDIUM AND DESIGN LAYOUT CORRECTING APPARATUS

CROSS-REFERENCE TO RELATED APPLICATIONS

This application is based upon and claims the benefit of priority from U.S. Provisional Application No. 61/875,964), filed on Sep. 10, 2013; the entire contents of which are incorporated herein by reference.

FIELD

Embodiments described herein relate generally to a design layout correcting method, a recording medium, and a design layout correcting apparatus.

BACKGROUND

When creating a mask pattern used for double patterning such as LELE (Litho-Etch-Litho-Etch), and the like, a design layout completed with DRC (Design Rule Check) is divided for double patterning. Two mask patterns are generated as a result of such division. An LCC (Lithography Compliance Check) is executed on the mask patterns used for the double patterning, and it is desired that the mask patterns do not have Hotspots.

Conventionally, when the Hotspot is found, the design layout is corrected, and the corrected design layout (entire range of the chip) is divided to generate two new mask patterns. The DRC and the LCC are again performed on the two new mask patterns. Even in such case, a new Hotspot is sometimes found at a position different from where the Hotspot was first found. In this case, the processes from the correction of the design layout to the LCC are repeated. Another new Hotspot is sometimes still found. In this case, the design layout may not be corrected, and the design period may possibly be extended. Thus, the design layout used for the double patterning is desirably corrected in a short time.

DETAILED DESCRIPTION

In general, according to one embodiment, a design layout correcting method is provided. In the design layout correcting method, a design layout of a circuit pattern formed in one layer is divided to at least a first mask pattern and a second mask pattern. When correcting the first mask pattern or the second mask pattern, a design pattern corresponding to a pattern defect area of the first or second mask pattern is set as a correcting target pattern. A correcting target region corresponding to an arrangement position of the correcting target pattern is set within the first or second mask pattern. Furthermore, a verifying region for performing the verification of the correcting target region is set within the first or second mask pattern. The correcting target pattern is then corrected within the correcting target region, and whether or not the first and second mask patterns are in a desired design layout is verified in the verifying region.

An exemplary embodiment of a design layout correcting method, a recording medium, and a design layout correcting apparatus will be hereinafter described in detail with reference to the accompanying drawings. The present invention is not limited to the following embodiment.

Embodiment

Figure 1:
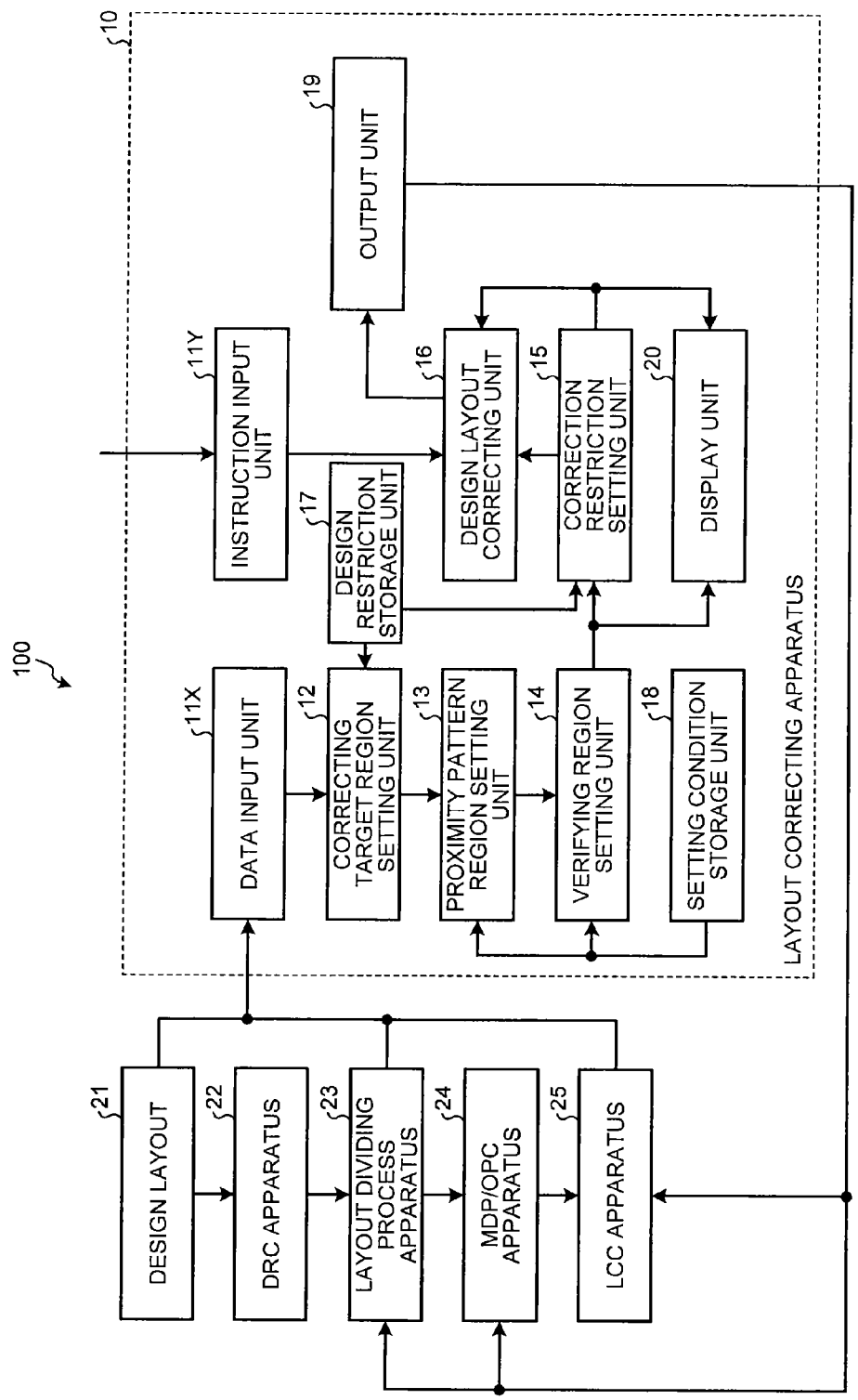
FIG. 1 is a block diagram illustrating a configuration of a layout correcting apparatus according to an embodiment.

FIG. 1 is a block diagram illustrating a configuration of a layout correcting apparatus according to an embodiment. A layout correcting apparatus 10 is a computer, and the like for correcting a design layout (design pattern group) of a semiconductor device. The layout correcting apparatus 10 of the present embodiment corrects a design layout corresponding to a mask pattern used in dual patterning (e.g., double patterning). The double patterning includes, for example, LELE (Litho-Etch-Litho-Etch) process, LLE (Litho-Litho-Etch) process, LFLE (Litho-Freeze-Litho-Etch) process, side wall process, and the like.

A mask data creating system 100 is a system for creating the mask data of the semiconductor device, and includes a plurality of apparatuses. Specifically, the mask data creating system 100 includes a design layout 21, a DRC (Design Rule Check) apparatus 22, a layout dividing process apparatus 23, a MDP (Mask Data Preparation)/OPC (Optical Proximity Correction) apparatus 24, an LCC (Lithograph Compliance Check) apparatus 25, a layout correcting apparatus 10, a mask producing apparatus (not illustrated) and the like.

The design layout 21 is a design layout (data of circuit pattern, etc.) of a semiconductor device. The design layout 21 is transmitted to the DRC apparatus 22 and the layout correcting apparatus 10.

The DRC apparatus 22 is an apparatus for performing DRC on the design layout 21. The DRC apparatus 22 transmits the design layout 21 determined as pass to the layout dividing process apparatus 23. If the design layout 21 is determined as fail in the DRC apparatus 23, the design layout 21 is corrected.

The layout dividing process apparatus 23 divides the design layout 21 to a first mask pattern and a second mask pattern so as to be useable for the double patterning. The first mask pattern is a mask pattern used when forming a first mask, and the second mask pattern is a mask pattern used when forming a second mask.

The layout dividing process apparatus 23 divides the entire design layout to the first mask pattern and the second mask pattern by setting each design pattern included in the design layout 21 to either the first mask pattern or the second mask pattern.

In other words, the layout dividing process apparatus 23 sets a dividing attribute to each design pattern included in the design layout 21. Specifically, the layout dividing process apparatus 23 sets each design pattern included in the design layout 21 to either a pattern (first dividing attribute) sorted to the first mask or a pattern (second dividing attribute) sorted to the second mask.

Hereinafter, a combination of the first and second mask patterns is sometimes referred to as an overall mask pattern. The design layout 21 to be divided is not limited to the entire design layout 21, and may be a part of the design layout 21.

The layout dividing process apparatus 23 divides the design layout 21 after setting a seam to the first and second mask patterns and ensuring a margin portion in the seam. In other words, the layout dividing process apparatus 23 divides the design layout 21 after setting a width of a margin, and the like to the position of the seam of when the design layout 21 is divided. The first mask pattern and the second mask pattern generated by the layout dividing process apparatus 23 are transmitted to the layout correcting apparatus 10 and the MDP/OPC apparatus 24.

The margin set by the layout dividing process apparatus 23 will now be described. The layout dividing process apparatus 23 sorts a great number of design patterns included in the design layout 21 to two masks when dividing the design layout 21 for double patterning. This sorting process is called division.

The layout dividing process apparatus 23 basically divides each design pattern so that a series of design patterns become the same mask (dividing attribute). The layout dividing process apparatus 23 ensures a margin at an area where the design pattern is cut when one design pattern is to be cut and divided and sorted to different masks in terms of the performance of the exposure device.

The layout dividing process apparatus 23 sets the margin in view of the process variation such as overlapping, and the like of the first mask and the second mask with respect to the cutting position (stitch) of one design pattern.

The MDP/OPC apparatus 24 executes the OPC with respect to each of the first and second mask patterns to create the mask pattern data from the first and second mask patterns. The MDP/OPC apparatus 24 executes the OPC with respect to the first mask pattern to create the first mask pattern data. The MDP/OPC apparatus 24 executes the OPC with respect to the second mask pattern to create the second mask pattern data. The first and second mask pattern data created by the MDP/OPC apparatus 24 are transmitted to the LCC apparatus 25.

The LCC apparatus 25 performs the LCC with respect to each of the first and second mask pattern data. The pattern position (Hotspot) determined as fail by the LCC apparatus 25 is transmitted to the layout correcting apparatus 10.

The Hotspot is a position (process fail position) of a pattern where the probability of a substrate pattern becoming a pattern defect is higher than a predetermined value when the substrate pattern (wafer pattern) is formed using the first and second mask patterns. In other words, the Hotspot may be a lithography difficulty point, processing difficulty point, and the like. The pattern defect may be, for example, short defect, open defect, or the like. Hereafter, the pattern in the Hotspot is referred to as Hotspot pattern (correction pattern). A case in which the pattern defect is a short defect will be hereinafter described.

The layout correcting apparatus 10 corrects the design layout 21 when the Hotspot is detected from at least one of the first and second mask patterns. The layout correcting apparatus 10 includes a data input unit 11X, an instruction input unit 11Y, a correcting target region setting unit 12, a proximity pattern region setting unit 13, a verifying region setting unit 14, a correction restriction setting unit 15, a design layout correcting unit 16, a design restriction storage unit 17, a setting condition storage unit 18, an output unit 19, and a display unit 20.

The data input unit 11X is input with the pattern position (Hotspot) determined as fail in the LCC apparatus 25, the first and second mask patterns divided by the layout dividing process apparatus 23, and the design layout 21, and transmits the same to the correcting target region setting unit 12.

The correcting target region setting unit 12 corresponds the Hotspot, the design layout 21, and the overall mask pattern, and stores the corresponded information as first fail information. The correcting target region setting unit 12 sets the correcting target region within the design layout in which the first and second mask patterns are arranged using the first fail information. The correcting target region is a region where the design layout 21 is corrected. In the correcting target region, the design layout 21 is corrected so that the Hotspot is avoided (resolved).

The instruction input unit 11Y inputs the instruction information from the user and transmits to the design layout correcting unit 16. The instruction information from the user is an instruction associated with the correction of the design layout 21.

The instruction information from the user is, for example, an instruction to move the position of the design pattern, an instruction to deform the design pattern, an instruction to change the dividing attribute of the design pattern, a re-dividing instruction (moving instruction to another mask) of the design layout 21, a combination of at least two of the above, and the like. The instruction to change the dividing attribute of the design pattern is an instruction to change the attribute of at least part of the design pattern from the first mask pattern to the second mask pattern, or an instruction to change the attribute of at least part of the design pattern from the second mask pattern to the first mask pattern.

The correcting target region setting unit 12 sets the correcting target region at a periphery of the Hotspot based on the information (design restriction to be described later) in the design restriction storage unit 17. In this case, the correcting target region setting unit 12, for example, extracts, as a correcting target pattern, a design pattern (design patterns connected at minimum restriction) in which the distance from the Hotspot pattern is a defined minimum value set in advance from the first and second mask patterns.

The terms used in the present embodiment will be defined below.

correcting target pattern: pattern group connected at minimum restriction (distance of defined minimum value), one of which being surely corrected. The correcting target pattern is set based on the Hotspot.

proximity pattern region: region within a predetermined distance from the correcting target pattern.

unlock pattern: design pattern within the proximity pattern region, and is a pattern that may be corrected as necessary. Hereinafter, the unlock pattern is sometimes referred to as the proximity pattern.

lock pattern: design pattern closest to the proximity pattern, and is a design pattern that is not to be corrected but needs to be taken into consideration when correcting the unlock pattern.

verifying region: region in which the proximity pattern region is broadened by an optical radius. Since the verifying region is a region that is subjected to the influence of the correction of the design pattern, verification of LCC, and the like becomes necessary after the correction.

The correcting target region setting unit 12 sets the region where the set correcting target pattern is arranged as the correcting target region. The correcting target region setting unit 12 includes the set correcting target region in the first fail information, and transmits the same to the proximity pattern region setting unit 13 as second fail information.

The proximity pattern region setting unit 13 sets the proximity pattern region so as to satisfy the setting condition (proximity pattern region setting condition) in the setting condition storage unit 18. The proximity pattern region setting unit 13 sets the proximity pattern region within the design layout using the second fail information. The proximity pattern region is a region to be referenced when the correcting target pattern is corrected. The proximity pattern region setting unit 13 sets the correcting target region and the peripheral region thereof as the proximity pattern region.

Specifically, the proximity pattern region setting unit 13 extracts, as the unlock pattern, the design pattern arranged in the region where the correcting target region is not set of the first and second mask patterns arranged at the periphery of the Hotspot. The proximity pattern region setting unit 13 sets the region where the extracted unlock pattern is arranged as the proximity pattern region. The unlock pattern is the design pattern arranged within a predetermined range from the Hotspot pattern, and the correction thereof is permitted as necessary. The proximity pattern region setting unit 13 includes the set proximity pattern region in the second fail information and transmits the same to the verifying region setting unit 14 as third fail information.

The verifying region setting unit 14 sets the verifying region so as to satisfy the setting condition (verifying region setting condition) in the setting condition storage unit 18. The verifying region setting unit 14 sets the verifying region in the design layout using the third fail information. The verifying information setting unit 14 sets the proximity pattern region and the peripheral region thereof as the verifying region. Furthermore, the verifying region setting unit 14 sets the design pattern closest to the proximity pattern region as the lock pattern. The verifying region setting unit 14 may set the design pattern closest to the unlock pattern as the lock pattern.

The verifying region setting unit 14 extracts the design pattern (correcting target pattern) in the correcting target region, the design pattern (unlock pattern) in the proximity pattern region, and the design pattern in the region broadened toward the outer side by a predetermined distance (e.g., optical radius) from the correcting target region. The verifying region setting unit 14 sets the region where the extracted design pattern is arranged as the verifying region. The verifying region includes the lock pattern. The verifying region setting unit 14 includes the set verifying region in the third fail information, and transmits the same to the correction restriction setting unit 15 and the display unit 20 as fourth fail information.

The design restriction storage unit 17 is connected to the correcting target region setting unit 12 and the correction restriction setting unit 15. The design restriction storage unit 17 is a memory for storing information (design restriction) associated with the restriction of when designing the design layout 21 or correcting the first and second mask patterns. An inter-pattern distance (defined minimum value), which needs to be secured between the design layouts, is set in the design restriction. The defined minimum value includes an inter-pattern distance to be separated in the first mask pattern, an inter-pattern distance to be separated in the second mask pattern, and an inter-pattern distance to be separated in the first and second design patterns. The correcting target region setting unit 12 sets the correcting target region based on the restriction of such distances.

The setting condition storage unit 18 is connected to the proximity pattern region setting unit 13 and the verifying region setting unit 14. The setting condition storage unit 18 is a memory for storing the setting condition, and the like used when setting the proximity pattern region and the verifying region. The setting condition includes the proximity pattern region setting condition, the unlock pattern setting condition, the lock pattern setting condition, and the verifying region setting condition.

In the proximity pattern region setting condition, for example, the following conditions (1) and (2) are set.

(1) The proximity pattern region is a region arranged within a predetermined range when seen from the Hotspot or the Hotspot pattern.

(2) The proximity pattern region is a region farther than the correcting target region (defined minimum value) when seen from the Hotspot or the Hotspot pattern.

The verifying region is a region in which when the design pattern is corrected in the correcting target region, the other design patterns are influenced by such correction. Therefore, the verifying region is set to a region (region in which the process condition changes by the correction of the first or second mask pattern) in which the correcting target region is broadened by the optical radius, for example. The optical radius is a region where the exposure light at the time of exposure interferes, and is determined by the wavelength of the exposure light. Thus, the verifying region is set based on the optical radius, which is set on the basis of the exposure condition of when performing exposure on the substrate using the first mask corresponding to the first mask pattern or the second mask corresponding to the second mask pattern.

The correction restriction setting unit 15 sets a movable region (correction guideline to be described later) with respect to the first or second mask pattern (Hotspot pattern), which is the Hotspot, based on the correcting target region, the proximity pattern region, and the design restriction. The correction guideline is a guideline for indicating to the user the correcting range (position, shape, size) that can be set in the Hotspot pattern (correction pattern). The correction guideline also includes adjustment limit, and the like of the position and the width of the margin set when dividing the design layout 21.

The correction restriction setting unit 15 sets for the correction guideline a movement position (range) that can be set in the Hotspot pattern when not changing the dividing attribute of the Hotspot pattern and a movement position (range) that can be set in the Hotspot pattern when changing the dividing attribute of the Hotspot pattern. The correction restriction setting unit 15 transmits the correction guideline to the design layout correcting unit 16 and the display unit 20.

The display unit 20 displays the Hotspot, the Hotspot pattern, the first mask pattern, the second mask pattern, the correcting target region, the correcting target pattern, the proximity pattern region, the unlock pattern, the lock pattern, the verifying region, the design restriction, the setting condition, the correction guideline, and the like.

The design layout correcting unit 16 corrects the first or second mask pattern based on the instruction information input to the instruction input unit 11Y. The design layout correcting unit 16 corrects the first or second mask pattern within a range satisfying the movement position (correction guideline) that can be set in the Hotspot pattern or the correcting target pattern. The design layout correcting unit 16 corrects, for example, the first or second mask pattern (Hotspot pattern or correcting target pattern) according to a user instruction within the correction guideline. The design layout correcting unit 16 displays the first and second mask pattern after the correction on the display unit 20.

When an instruction to re-divide the first and second mask patterns being corrected is transmitted from the instruction input unit 11Y, the design layout correcting unit 16 transmits the first and second mask patterns after the correction to the layout dividing process apparatus 23 through the output unit 19.

When an instruction to perform the LCC is transmitted from the instruction input unit 11Y, the design layout correcting unit 16 transmits the first and second mask patterns after the correction to the LCC apparatus 25 through the output unit 19.

The design restriction in the design restriction storage unit 17 may be information that can be rewritten according to the instruction from the user. In this case, the design restriction input from the instruction input unit 11Y is stored in the design restriction storage unit 17.

The setting condition in the setting condition storage unit 18 may be information that can be rewritten according to the instruction from the user. In this case, the setting condition input from the instruction input unit 11Y is stored in the setting condition storage unit 18.

In the LCC apparatus 25, when the mask pattern is determined as pass, the mask is formed using the mask pattern determined as pass. When the double patterning is carried out, the first mask is formed using the mask pattern data corresponding to the first mask pattern, and the second mask is formed using the mask pattern data corresponding to the second mask pattern. Thus, when the double patterning is carried out, the design layout 21 is divided into two mask patterns, and the mask is formed with respect to each mask pattern after the division.

Figure 2:
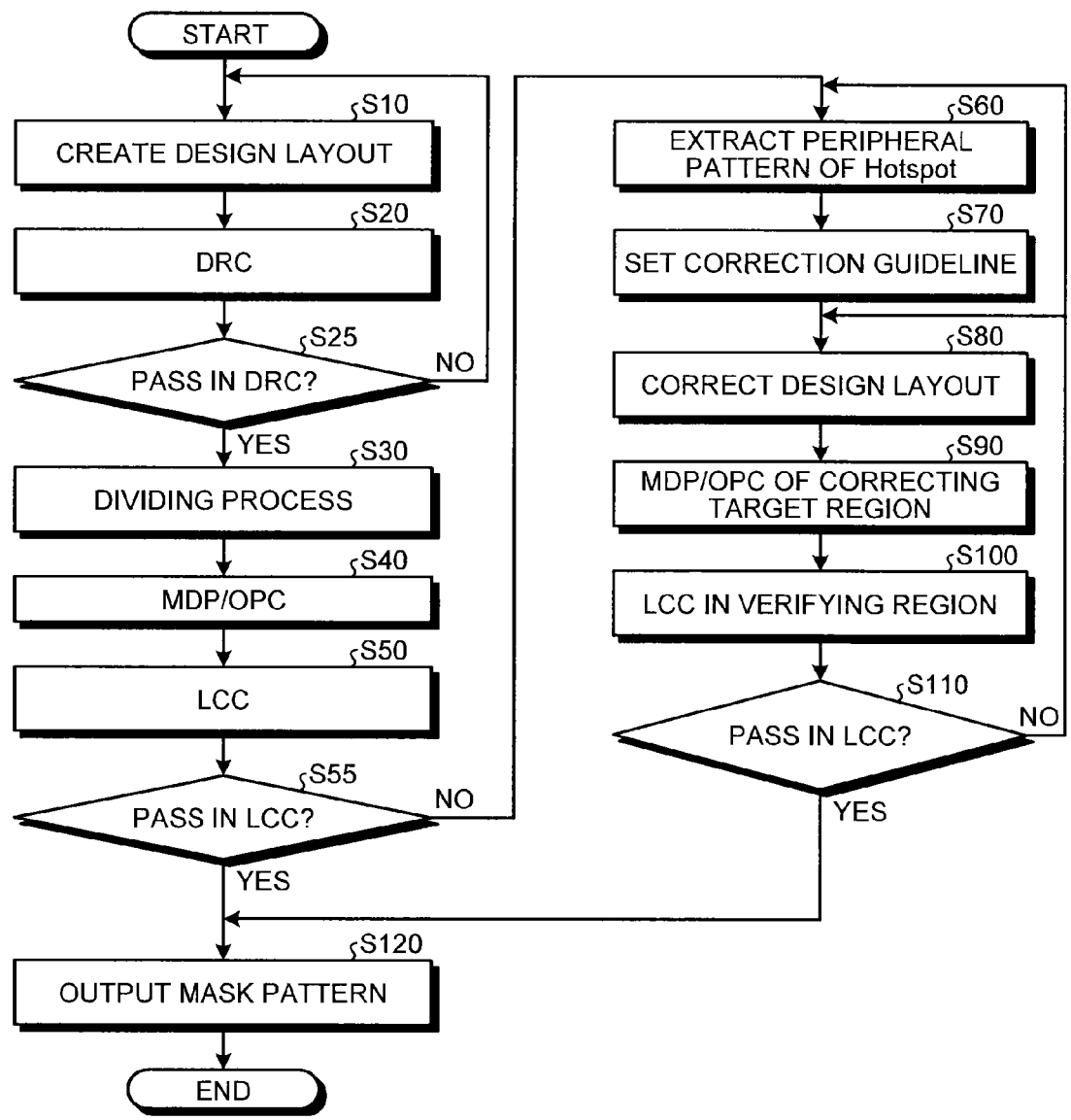
FIG. 2 is a flowchart illustrating a creating process procedure of mask data.

Next, a creating process procedure of the mask pattern data will be described. FIG. 2 is a flowchart illustrating the creating process procedure of the mask data. A design layout creating apparatus creates the design layout 21 of the semiconductor device (step S10).

The created design layout 21 is input to the DRC apparatus 22. The DRC apparatus 22 performs the DRC on the design layout 21 (step S20). When the DRC apparatus 22 determines that the design layout 21 is fail (No in step S25), the design layout 21 is corrected (step S10). The DRC apparatus 22 performs the DRC on the design layout 21 after the correction (step S20).

In the mask data creating system 100, the processes of steps S10 to S25 are repeated until the determined pass in the DRC. When the DRC apparatus 22 determines as pass in the DRC (Yes in step S25), the design layout 21 determined as pass is input to the layout dividing process apparatus 23.

The layout dividing process apparatus 23 divides the design layout 21 to the first mask pattern and the second mask pattern so as to be usable for the double patterning (step S30). The first mask pattern is thereby set to the first dividing attribute. The second mask pattern is set to the second dividing attribute. The first mask pattern and the second mask pattern generated by the layout dividing process apparatus 23 are transmitted to the MDP/OPC apparatus 24.

The MDP/OPC apparatus 24 executes the OPC with respect to the first mask pattern to create the first mask pattern data. The MDP/OPC apparatus 24 executes the OPC with respect to the second mask pattern to create the second mask pattern data (step S40).

The first and second mask pattern data created by the MDP/OPC apparatus 24 are transmitted to the LCC apparatus 25. The LCC apparatus 25 performs the LCC on each of the first and second mask patterns (step S50). When determined as pass by the LCC apparatus 25 (Yes in step S55), the LCC apparatus 25 outputs the first and second mask patterns to a mask producing apparatus (step S120). The mask producing apparatus produces the first and second masks using the first and second mask pattern data determined as pass.

When determined as fail (No in step S55), the LCC apparatus 25 transmits the Hotspot in the first or second mask pattern determined as fail to the layout correcting apparatus 10. The LCC apparatus 25 transmits the first and second mask pattern data determined as fail to the layout correcting apparatus 10. The design layout 21 corresponding to the first and second mask patterns determined as fail is transmitted to the layout correcting apparatus 10.

Thereafter, the process of correcting the design layout 21 is started in the layout correcting apparatus 10. The data input unit 11X of the layout correcting apparatus 10 inputs the design layout 21, the first and second mask patterns, and the Hotspot, and transmits the same to the correcting target region setting unit 12.

The correcting target region setting unit 12 stores the first fail information in which the design layout 21, the first and second mask patterns, and the Hotspot are corresponded. The correcting target region setting unit 12 sets the correcting target pattern and the correcting target region within the design layout using the first fail information.

Specifically, the correcting target region setting unit 12 extracts the design pattern (peripheral pattern) arranged at the peripheral region of the Hotspot as the correcting target pattern, and sets the region where the extracted correcting target pattern is arranged as the correcting target region (step S60). In this case, the correcting target region setting unit 12 extracts the correcting target pattern and sets the correcting target region based on the design restriction (distance from the Hotspot, etc.) in the design restriction storage unit 17. The correcting target region setting unit 12 includes the set correcting target pattern and the correcting target region in the first fail information, and transmits the same to the proximity pattern region setting unit 13 as the second fail information.

The proximity pattern region setting unit 13 sets the proximity pattern region, the unlock pattern, and the lock pattern in the design layout using the second fail information. In this case, the proximity pattern region setting unit 13 sets the proximity pattern region so as to satisfy the proximity pattern region setting condition in the setting condition storage unit 18. The proximity pattern region setting unit 13 also sets the unlock pattern so as to satisfy the unlock pattern setting condition, and sets the lock pattern so as to satisfy the lock pattern setting condition. The proximity pattern region setting unit 13 includes the set proximity pattern region, the unlock pattern, and the lock pattern in the second fail information and transmits the same to the verifying region setting unit 14 as third fail information.

The verifying region setting unit 14 sets the verifying region in the design layout using the third fail information. In this case, the verifying region setting unit 14 sets the verifying region so as to satisfy the verifying region setting condition in the setting condition storage unit 18. The verifying region setting unit 14 includes the set correcting target region in the third fail information, and transmits the same to the correction restriction setting unit 15 as the fourth fail information. The verifying region setting unit 14 transmits the fourth fail information to the display unit 20.

Figure 3:
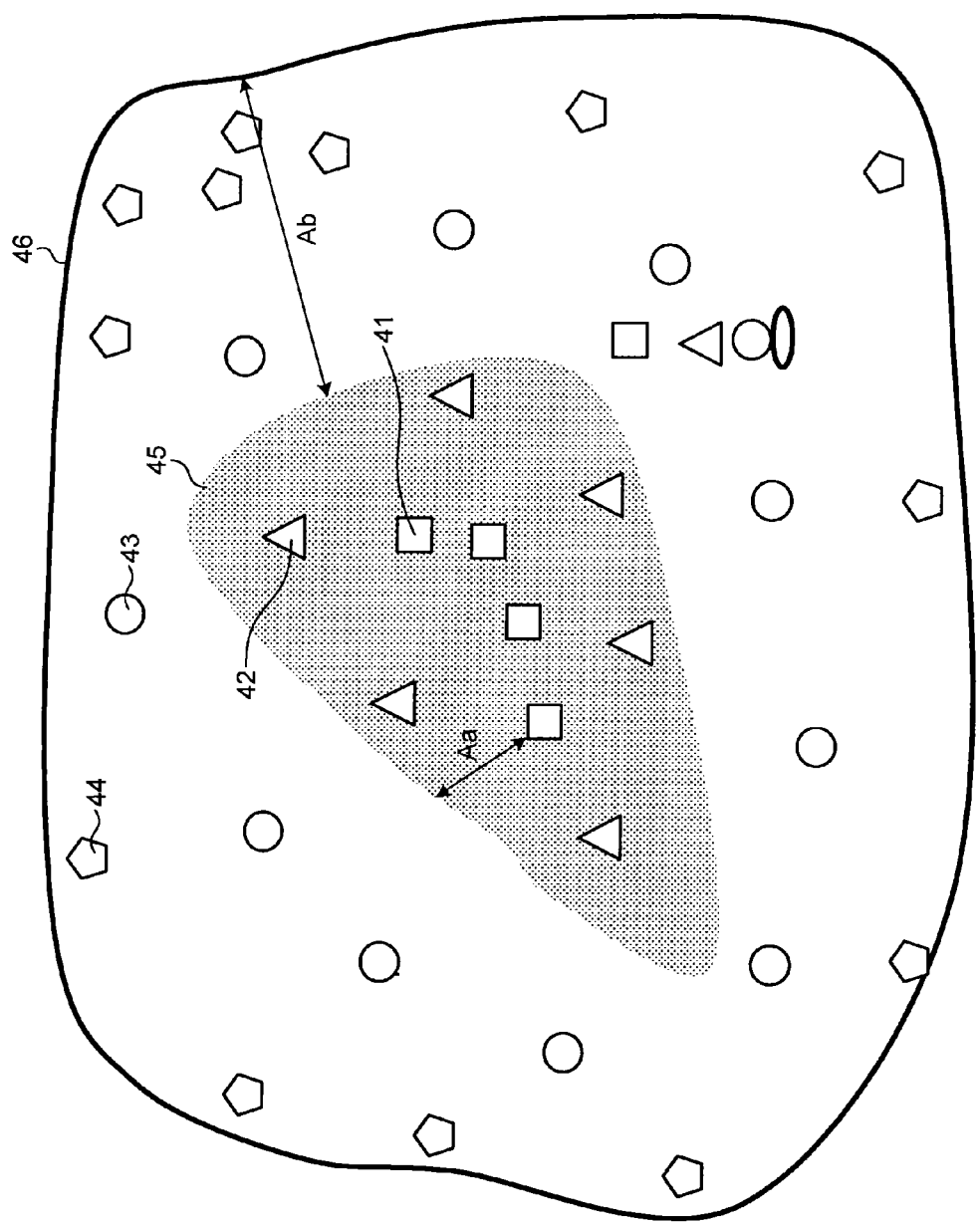
FIG. 3 is a view schematically illustrating a setting example of a pattern and a region set at a periphery of a correcting target pattern.

FIG. 3 is a view schematically illustrating a setting example of a pattern and a region set at a periphery of a correcting target pattern. Here, the correcting target pattern is indicated as the correcting target pattern 41, the unlock pattern is indicated as the unlock pattern 42, and the lock pattern is indicated as the lock pattern 43. The proximity pattern region is indicated as the proximity pattern region 45, and the verifying region is indicated as the verifying region 46. A design pattern not corresponding to any of the correcting target pattern 41, the unlock pattern 42, and the lock pattern 43 among the design patterns of the verifying region 46 is indicated as other design pattern 44.

As illustrated in FIG. 3, the region within a distance Aa from the correcting target pattern 41 is set as the proximity pattern region 45. Among the design patterns in the proximity pattern region 45, the design patterns other than the correcting target pattern 41 are set as the unlock pattern 42. Furthermore, the design pattern closest from each coordinate on the outer peripheral portion of the proximity pattern region 45 is set as the lock pattern 43. A region in which the proximity pattern region 45 is broadened by the optical radius Ab is set as the verifying region 46.

The correction restriction setting unit 15 sets the region (correction guideline) in which the Hotspot pattern can be moved based on the design restriction (step S70). The correction restriction setting unit 15 sets for the correction guideline a movement position that can be set in the Hotspot pattern when not changing the dividing attribute of the Hotspot pattern and a movement position that can be set in the Hotspot pattern when changing the dividing attribute of the Hotspot pattern. The correction restriction setting unit 15 may set the region (correction guideline) in which the correcting target pattern can move based on the design restriction. Hereinafter, a case in which the correcting target pattern is the Hotspot pattern will be described. The correction restriction setting unit 15 transmits the correction guideline to the design layout correcting unit 16. The correction restriction setting unit 15 transmits the correction guideline to the display unit 20.

The display unit 20 displays the correction guideline. The user inputs a correction instruction to the instruction input unit 11Y while referencing the first and second mask patterns, the Hotspot, the Hotspot pattern, the dividing attribute of the Hotspot pattern, and the correction guideline (movable regions E1 to E3, etc., to be described later) displayed on the display unit 20.

The design layout correcting unit 16 then corrects the first or second mask pattern based on the correction instruction of the Hotspot pattern (step S80). The design layout correcting unit 16 corrects the position, shape, size, dividing attribute, and the like of the Hotspot pattern. Specifically, the design layout correcting unit 16 corrects the position, shape, size, dividing attribute, and the like of the correcting target pattern, and also corrects the position, shape, size, dividing attribute, and the like of the unlock pattern, as necessary. In this case, the design layout correcting unit 16 corrects the unlock pattern such that the patterns between the unlock pattern and the lock pattern do not violate the design restriction.

The design layout correcting unit 16 transmits the first and second mask patterns after the correction to the MDP/OPC apparatus 24 through the output unit 19. The MDP/OPC apparatus 24 executes the OPC on the correcting target region, thus creating the first and second mask patterns (step S90). The first and second mask patterns created by the MDP/OPC apparatus 24 are transmitted to the LCC apparatus 25.

The LCC apparatus 25 performs the LCC on each of the first and second mask patterns in the verifying region (step S100). When determined as fail in the LCC (step S110, No), the pattern position determined as fail by the LCC apparatus 25 is transmitted to the layout correcting apparatus 10 as a Hotspot.

Thereafter, the first and second mask patterns are further corrected in accordance with the instruction from the user in the layout correcting apparatus 10. The layout correcting apparatus 10 performs the correction of the first or second mask pattern in the correcting target region, for example. In this case, the processes of steps S80 to S110 are repeated until determined as pass by the LCC apparatus 25 in the mask data creating system 100.

The layout correcting apparatus 10 may correct the first or second mask pattern after broadening the correcting target region. In this case, the layout correcting apparatus 10 executes the process of broadening the correcting target region and the process of creating the correction guideline corresponding to a new correcting target region. Specifically, the correcting target region setting unit 12 executes the process of broadening the correcting target region, and the correction restriction setting unit 15 executes the process of creating the correction guideline.

For example, if the Hotspot is not resolved although the layout correcting apparatus 10 moved the Hotspot pattern until the distance between the Hotspot pattern and the proximity pattern (unlock pattern) became a defined minimum value, the layout correcting apparatus 10 executes the process of broadening the correcting target region. The layout correcting apparatus 10 may execute the process of broadening the correcting target region in accordance with the instruction from the user.

When broadening the correcting target region, the correcting target region setting unit 12 sets the proximity pattern, in which the Hotspot pattern is approached until the defined minimum value is obtained, to the new correcting target region. In the proximity pattern, the distance between the Hotspot pattern and the proximity pattern is the defined minimum value.

Thereafter, the processes of steps S80 to S110 are repeated until determined as pass by the LCC apparatus 25 in the mask data creating system 100. If the Hotspot is not resolved, the processes of steps S60 to S110 or the processes of steps S80 to S110 are repeated until determined as pass by the LCC apparatus 25 in the mask data creating system 100.

When determined as pass by the LCC apparatus 25 (Yes in step S110), the mask producing apparatus produces the mask using the first and second mask patterns determined as pass (step S120).

In the flowchart illustrated in FIG. 2, a case in which the DRC is omitted and the MDP/OPC is executed after the first or second mask pattern is corrected has been described, but the MDP/OPC apparatus 24 may perform the DRC on the first or second mask pattern (correcting target region) after the correction after the first or second mask pattern is corrected.

Figure 4:
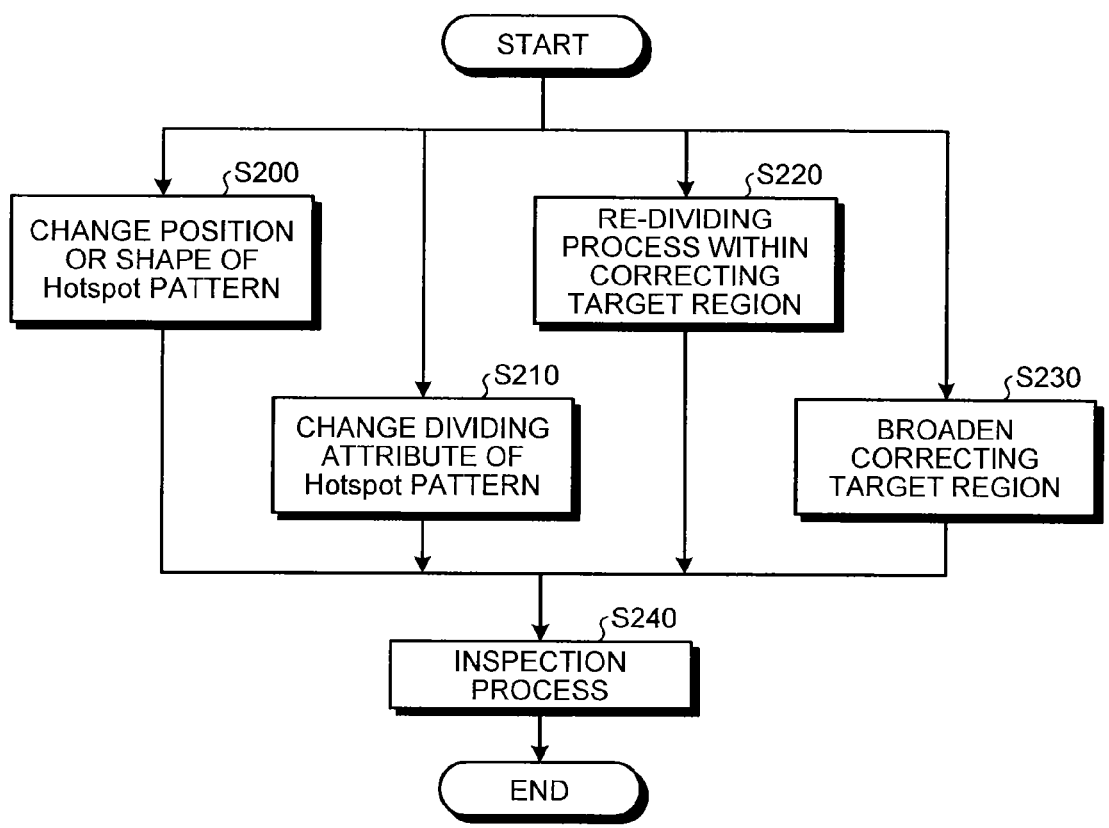
FIG. 4 is a flowchart illustrating a correction process procedure of first or second mask patterns.

The correction process procedure of the first or second mask pattern will be described below. FIG. 4 is a flowchart illustrating the correction process procedure of the first or second mask pattern. The layout correcting apparatus 10, for example, changes at least one of the position, shape, and size of the Hotspot pattern without changing the correcting target region (step S200). In the Hotspot pattern, the position, shape, size, or the like is thus changed within the range satisfying the design restriction. In this case, the design layout correcting unit 16 changes the Hotspot pattern in view of the design restriction between the Hotspot pattern and the unlock pattern, and the like.

In the present embodiment, the design layout correcting unit 16 changes the position, shape, size, or the like of the Hotspot pattern so that the Hotspot pattern approaches the proximity pattern in accordance with the correction guideline. The design layout correcting unit 16 may change the position, shape, size, or the like of the unlock pattern. In this case, the design layout correcting unit 16 changes the unlock pattern in view of the design restriction between the unlock pattern and the lock pattern, and the like.

After the position, and the like of the Hotspot pattern are changed, an inspection process is executed on the first and second mask patterns in the mask data creating system 100 (step S240). The inspection process on the first and second mask patterns is the process of steps S90 and S100 described in FIG. 2.

If the Hotspot is not resolved (if determined as fail in the LCC apparatus 25), the design layout correcting unit 16 changes the dividing attribute of at least part of the Hotspot pattern (step S210). The design layout correcting unit 16 changes the dividing attribute of at least part of the Hotspot pattern to the dividing attribute different from the dividing attribute of the correcting target pattern when the correcting target pattern and the Hotspot pattern have the same dividing attribute (same design layout), for example. The design layout correcting unit 16 changes the dividing attribute of at least part of single line pattern when the Hotspot pattern is the single line pattern, for example.

The design layout correcting unit 16 may change the dividing attribute of the Hotspot pattern, and then change the position, and the like of the Hotspot pattern. After the dividing attribute and the position, and the like of the Hotspot pattern are changed, the inspection process on the first and second mask patterns is executed in the mask data creating system 100 (step S240).

If the Hotspot is not resolved even after changing the dividing attribute of the Hotspot pattern, the design layout correcting unit 16 transmits the first and second mask patterns to the layout dividing process apparatus 23 through the output unit 19. The first and second mask patterns transmitted to the layout dividing process apparatus 23 may be of before correction or in correction.

The layout dividing process apparatus 23 executes the re-dividing process on the design layout 21 of before correction or the design layout 21 in correction. Specifically, the layout dividing process apparatus 23 executes a process of re-dividing the design layout within the correcting target region of the design layout 21 to a new first mask pattern and a new second mask pattern (step S220).

If the correcting target region is changed in the design layout 21 in correction, the layout dividing process apparatus 23 executes the re-dividing process of the design layout 21 with respect to the correcting target region of after the change. Thereafter, the inspection process on the first and second mask patterns is executed in the mask data creating system 100 (step S240).

If the Hotspot is not resolved even after executing the process of re-dividing the correcting target region, the proximity pattern region, the verifying region, the correction guideline, and the like are changed. Specifically, the proximity pattern region setting unit 13 resets the proximity pattern region, and the verifying region setting unit 14 resets the verifying region. Furthermore, the correction restriction setting unit 15 resets the correction guideline.

The design layout correcting unit 16 executes the process of step S200 or step S210 with respect to the re-divided first and second mask patterns based on the reset correction guideline.

The design layout correcting unit 16 may execute both processes of step S200 and step S210 with respect to the re-divided first and second mask patterns. Thereafter, the inspection process on the first and second mask patterns is executed (step S240).

In the mask data creating system 100, the processes of steps S210 to S220 are repeated. If the Hotspot is not resolved even after the processes of steps S210 to S220 are repeated, the correcting target region setting unit 12 executes the process of broadening the correcting target region (step S230).

In this case, the proximity pattern region, the verifying region, the correction guideline, and the like are changed with the change of the correcting target region. Specifically, the proximity pattern region setting unit 13 resets the proximity pattern region, and the verifying region setting unit 14 resets the verifying region. Furthermore, the correction restriction setting unit 15 resets the correction guideline. Thereafter, the inspection process on the first and second mask patterns is executed in the mask data creating system 100 (step S240).

If the Hotspot is not resolved even after the process of broadening the correcting target region is executed, the design layout correcting unit 16 executes the process of step S200, step S210, or step S220 with respect to the first or second mask pattern in which the correcting target region is broadened The design layout correcting unit 16 may execute at least two processes of steps S200 to S220 with respect to the first or second mask pattern executed with the process of broadening the correcting target region. Thereafter, the inspection process on the first and second mask patterns is executed (step S240).

In the mask data creating system 100, the processes of steps S200 to S220, S240 are repeated. If the Hotspot is not resolved even after the processes of steps S200 to S220, S240 are repeated, the processes of steps S200 to S240 are repeated in the mask data creating system 100. Thus, the first and second mask patterns in which the Hotspot is resolved can be obtained.

Figure 5:
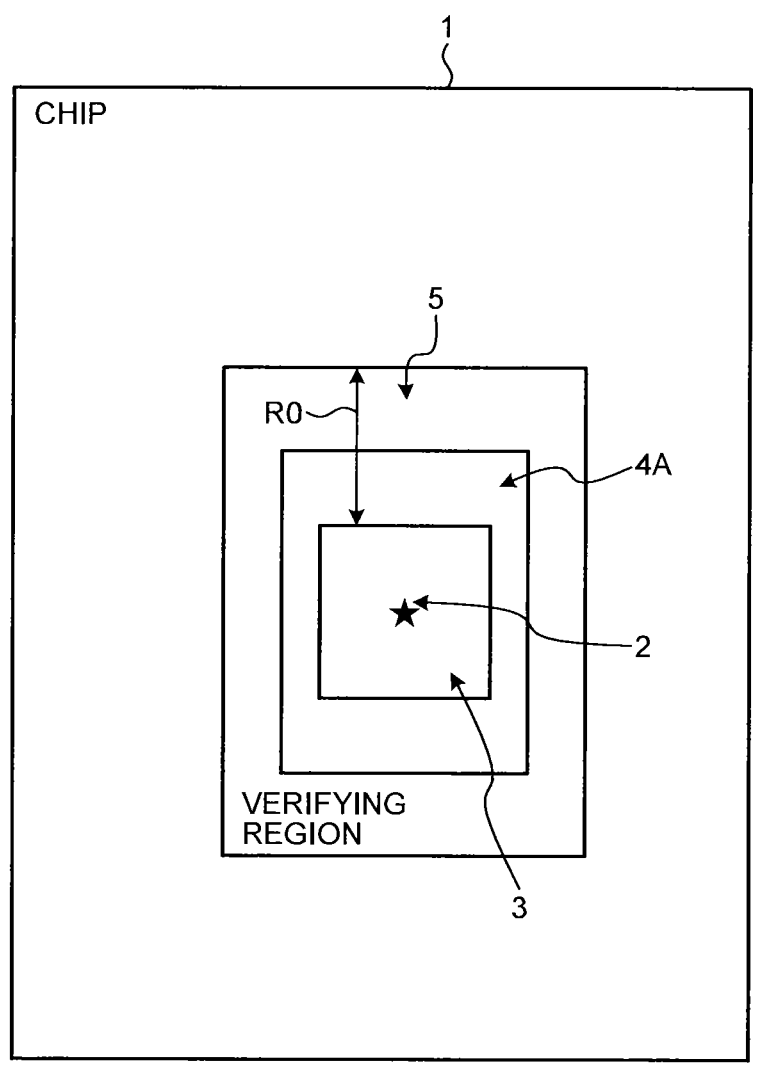
FIG. 5 is a view describing a verifying region set in a chip.

The verifying region will now be described. FIG. 5 is a view describing a verifying region set in a chip. In FIG. 5, the top view of the chip 1 is schematically illustrated. In the chip 1, the correcting target region 3 is a region where the correcting target pattern is arranged. The correcting target pattern is arranged at a predetermined distance (defined minimum value) from the Hotspot 2, and thus the correcting target region 3 is set at the periphery of the Hotspot 2. The correcting target region 3 is, for example, a rectangular region having the Hotspot 2 as the center.

Furthermore, the proximity pattern region 4A is set in a region on the outer side of the correcting target region 3 in the chip 1. The proximity pattern region 4 is an annular region proximate to the outer side of the correcting target region 3 or a part of the annular region.

Furthermore, the verifying region 5 is set on the outer side of the correcting target region 3 and the proximity pattern region 4 in the chip 1. The verifying region 5 is a rectangular region including the correcting target region 3 and the proximity pattern region 4A, as well as the region on the outer side thereof. For example, the verifying region 5 is set so that the distance from the correcting target region 3 becomes a distance R0 corresponding to the optical radius.

Figure 6:
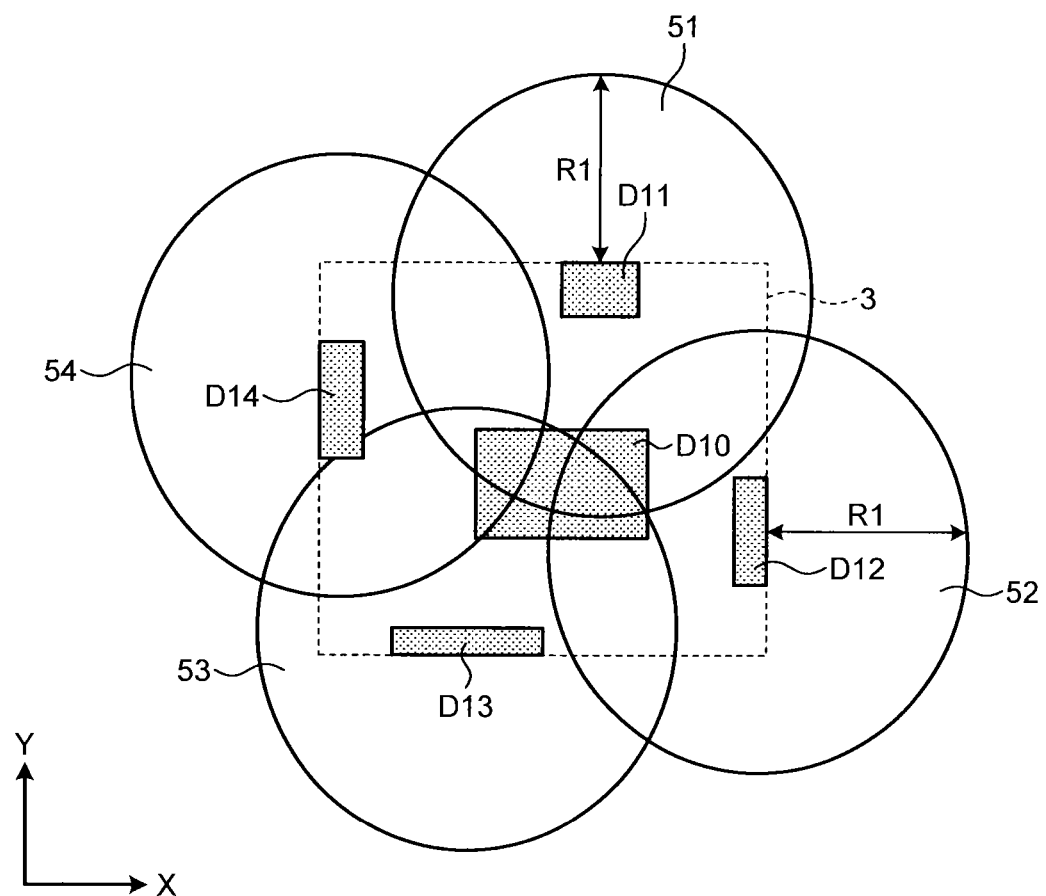
FIG. 6 is a view describing one example of a setting method of the verifying region.

FIG. 6 is a view describing one example of a setting method of the verifying region. In FIG. 6, the top view of the correcting target region 3 is illustrated. The correction patterns D10 to D14 are arranged in the correcting target region 3. The correction patterns D10 to D14 are actually corrected design patterns, and for example, are correcting target patterns. The correction patterns D10 to D14 may be unlock patterns. The correction patterns D10 to D14 may be design patterns that are not corrected. In this case, the correction patterns D10 to D14 are both the correcting target pattern and the unlock pattern, and the region where the correction patterns D10 to D14 are arranged is the proximity pattern region.

The verifying region 5 is a region in which the correction patterns D10 to D14 are broadened by an optical radius R1. In FIG. 6, the regions in which the correction patterns D11 to D14 are broadened by the optical radius R1 are illustrated as the verifying regions 51 to 54, respectively. The illustration of the region in which the correction pattern D10 is broadened by the optical radius R1 is omitted.

The verifying region setting unit 14 sets, for example, the verifying regions 51 to 54, and the region (periphery of Hotspot) on the inner side than the verifying regions 51 to 54 in the verifying region 5. The verifying region setting unit 14 may set the region in which the correcting target region 3 itself is broadened by the optical radius R1 as the verifying region 5.

The verifying region setting unit 14 may have ranges within the optical radius R1 having a predetermined point (e.g., middle point of a side farthest from the Hotspot) in the correction patterns D11 to D14 as the center as the verifying regions 51 to 54.

The verifying region setting unit 14 may have a rectangular region broadened by ±R in the X direction and by ±R in the Y direction from the correction patterns D11 to D14 as the verifying regions 51 to 54.

The verifying region setting unit 14 may set the rectangular regions broadened by ±R in the X direction and by ±R in the Y direction from the predetermined point (e.g., middle point position) in the correction patterns D11 to D14 as the verifying regions 51 to 54.

The verifying region setting unit 14 may set the region surrounded with line segments (s1) to (s4) of the points on the correction patterns D11 to D14 as the verifying region 5.

(s1) line segment in the X direction including a point (point on upper side of correction pattern D11 in FIG. 6) farthest in the +Y direction from the Hotspot (s2) line segment in the Y direction including a point (point on right side of correction pattern D12 in FIG. 6) farthest in the +X direction from the Hotspot (s3) line segment in the X direction including a point (point on lower side of correction pattern D13 in FIG. 6) farthest in the –Y direction from the Hotspot (s4) line segment in the Y direction including a point (point on left side of correction pattern D14 in FIG. 6) farthest in the –X direction from the Hotspot The optical radius R1 used for the setting of the verifying region 5 will now be described. When the design pattern is corrected in the correcting target region 3, the peripheral pattern of the corrected design pattern is influenced by dimension, shape, and the like. In such case as well, the region on the outer side than the optical radius R1 having the corrected design pattern as the center is not influenced by correction.

Therefore, the verifying region setting unit 14 of the present embodiment excludes the region on the outer side than the optical radius R1 having the corrected design pattern as the center from the verifying region. In other words, the verifying region setting unit 14 sets the region on the inner side than the optical radius R having the corrected design pattern (Hotspot pattern) as the center as the verifying region.

The verifying region setting unit 14 may set the region in which the degree of influence from the correcting target region 3 is within a predetermined SPEC as the verifying region. The degree of influence is the value evaluated with the mutual intensity between two points on the design layout 21. Therefore, the degree of influence is calculated based on the Fourier pattern of an effective light source distribution (σ) of a light source arranged in the exposure device. The Fourier pattern distribution is localized when the area of the light source is large, and the Fourier pattern distribution is spread out when the area of the light source is small. Thus, the degree of influence from the optical radius R1 becomes smaller the closer the integral value within the optical radius R1 is to one.

Figure 7:
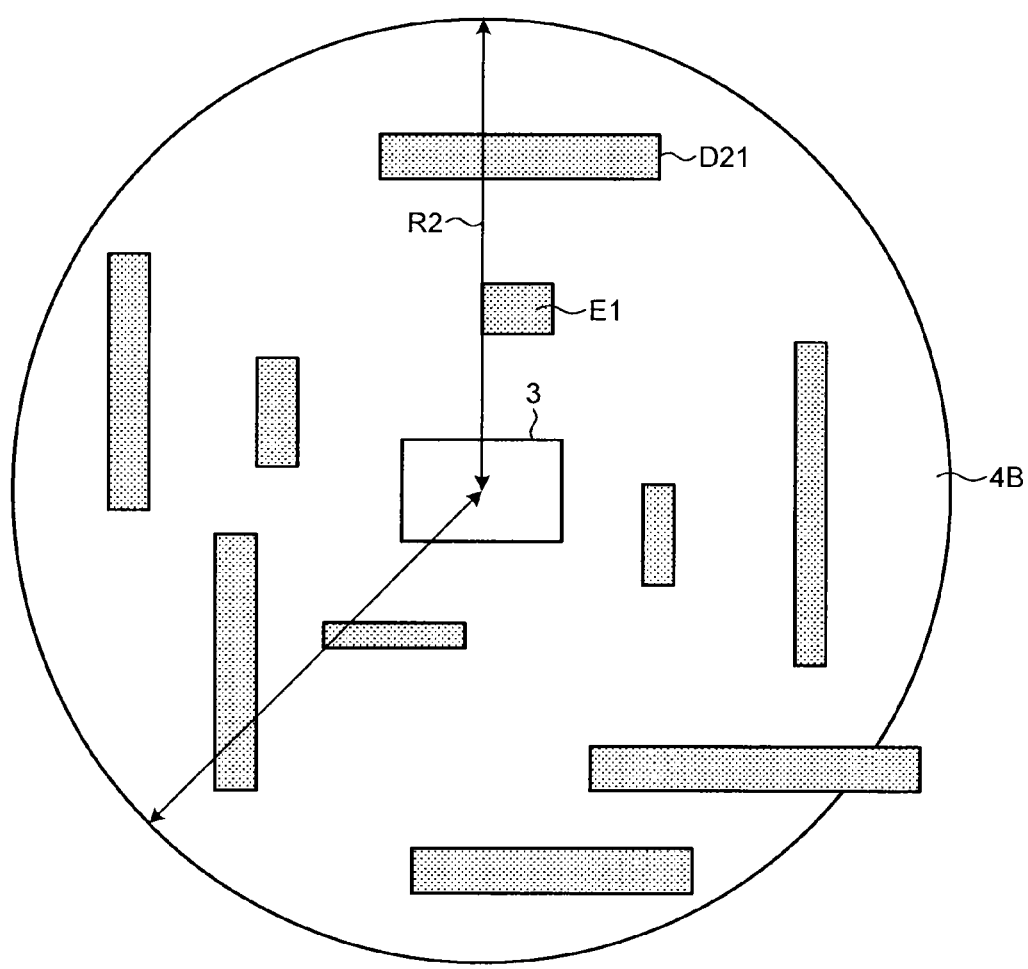
FIG. 7 is a view describing a setting method of a proximity pattern.

FIG. 7 is a view describing a setting method of a proximity pattern. In FIG. 7, a top view of the proximity pattern region 4B serving as the proximity pattern region is illustrated. The proximity pattern region setting unit 13 extracts the design pattern other than the correction pattern, the design pattern being arranged within a predetermined range from the correcting target region 3, as the unlock pattern D21.

The proximity pattern region setting unit 13, for example, extracts the design pattern arranged within a radius R2 with the correcting target region 3 as the center as the unlock pattern D21. In this case, the proximity pattern region setting unit 13 does not include the correction pattern in the unlock pattern D21.

The proximity pattern region setting unit 13 sets the region where the extracted unlock pattern D21 is arranged as the proximity pattern region 4B. In other words, the proximity pattern region setting unit 13 sets a circular region (region including the correcting target region 3) within a radius R2 having the correcting target region 3 as the center as the proximity pattern region 4B.

A case in which the proximity pattern region 4B is a circular region has been described herein, but the proximity pattern region 4B may be a rectangular region. The center of the proximity pattern region 4B may be a barycenter of the correcting target region 3 or may be a vertex of the correcting target region 3. The center of the proximity pattern region 4B may be the correcting target region 3 itself. In this case, the region of the radius R2 is set with each point on each side configuring the correcting target region 3 as the center, and the region obtained by adding up the set regions is set as the proximity pattern region 4B. The center of the proximity pattern region 4B may be a Hotspot pattern 61 (Hotspot 2).

Figure 8:
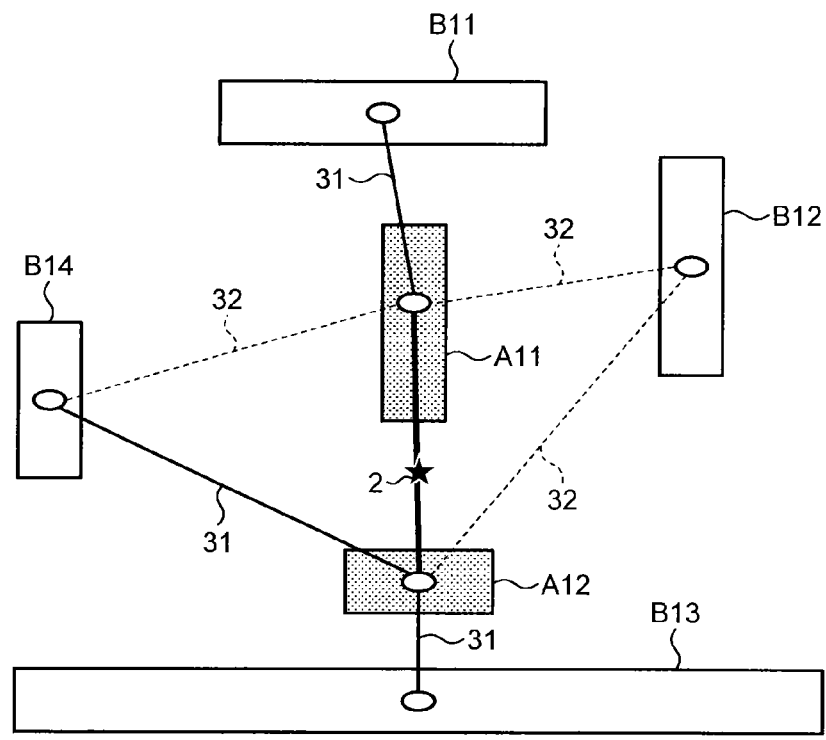
FIG. 8 is a view describing the correcting target pattern and the proximity pattern set in the chip.

FIG. 8 is a view describing the correcting target pattern and the proximity pattern set in the chip. In FIG. 8, a top view of the first and second mask patterns is illustrated. The first design patterns A11, A12, which are the first mask patterns, and the second design patterns B11 to B14, which are the second mask patterns, are illustrated.

For example, when short defect (defect in which the inter-design pattern distance becomes shorter than the desired value) (Hotspot 2) occurs between the first design pattern A11 and the first design pattern A12, the first design patterns A11, A12 become the Hotspot patterns. In this case, the region where the first design patterns A11, A12, which are the Hotspot patterns, and the second design patterns B11, B13, B14 connected to the first design patterns A11, A12 at a defined minimum value are arranged becomes the correcting target region 3. At least one of the correcting target patterns (first design patterns A11, A12, second design patterns B11, B13, B14), which are design patterns in the correcting target region 3 is corrected.

The first design patterns A11, A12 of the design patterns illustrated in FIG. 8 may be the correcting target pattern. In this case, the region where the first design patterns A11, A12 are arranged becomes the correcting target region 3. The correction process of when the first design patterns A11, A12 are assumed as the correcting target patterns will be described below.

The defined minimum value is set for each shape of the design pattern in the design restriction. For example, the defined minimum value includes the defined minimum value that needs to be satisfied by the distal ends in the longitudinal direction of the line pattern. The defined minimum value also includes the defined minimum value that needs to be satisfied by the distal ends in the short-side direction of the line pattern. The defined minimum value furthermore includes the defined minimum value that needs to be satisfied between the distal end in the longitudinal direction of the line pattern and the distal end in the short-side direction of the line pattern (between abutting patterns).

The correcting target region setting unit 12 extracts the second design pattern B11 having the defined minimum value relationship with the first design pattern A11. The correcting target region setting unit 12 also extracts the second design patterns B13, B14 having the defined minimum value relationship with the first design pattern A12.

The proximity pattern region setting unit 13 extracts the second design patterns B12, B14 as the proximity patterns with respect to the first design pattern A11. The proximity pattern region setting unit 13 extracts the second design pattern B12 as the proximity pattern with respect to the first design pattern A12.

In the present embodiment, a graph is used for a space margin between the design patterns. In FIG. 8, a branch (distance restriction between design patterns) stretched between the design patterns is illustrated as branches 31, 32 when the design pattern is assumed as a point.

The branches 31, 32 are margin branches that do not violate the minimum interval (defined minimum value) set between the design patterns. A violation branch that violates the minimum interval set between the design patterns is stretched between the first design patterns A11, A12. In the present embodiment, the correction restriction setting unit 15 sets the branches 31, 32 based on the design restriction, the correcting target region 3, and the proximity pattern region.

The branch stretched between the design patterns having the defined minimum value (minimum restriction) relationship between the design patterns is the branch 31 illustrated with a solid line. The branch stretched between the design patterns (between the Hotspot and the proximity pattern) arranged at a distance spaced apart than the defined minimum value between the design patterns is the branch 32 illustrated with a dotted line. The branches 31, 32 are thus set based on the design restriction.

For example, the branch between the first design pattern A11 and the second design pattern B11 is the branch 31. The branch between the first design pattern A12 and the second design pattern B14 is the branch 31. The branch between the first design pattern A12 and the second design pattern B13 is the branch 31.

The branch between the first design pattern A11 and the second design pattern B12 is the branch 32. The branch between the first design pattern A11 and the second design pattern B14 is the branch 32. The branch between the first design pattern A12 and the second design pattern B14 is the branch 32.

The proximity pattern region setting unit 13 sets the changeable range of the position, shape, and size of the design pattern as the weight with respect to each branch 31, 32. For example, the proximity pattern region setting unit 13 sets how much it can be approached than the current distance with respect to each branch 32 as the weight (correction restriction) of the branch 32. The proximity pattern region setting unit 13 thus sets the changeable amount of the design pattern in which the branch 32 is stretched.

The design patterns in which the branch 31 is spread is the inter-design pattern distance of the defined minimum value, and thus the distance between the design patterns of the branch 31 cannot be further reduced. Therefore, the Hotspot pattern can only move the design pattern in a direction of spreading the design patterns with respect to the branch 31. In other words, if the branch 31 is stretched, the Hotspot pattern cannot be moved in a direction (direction of approaching the polygon) in which the inter-pattern distance becomes shorter than the branch 31.

For example, the branch 31 is stretched between the first design pattern A11 and the second design pattern B11. Thus, the correction of the design pattern to approach the first design pattern A11 to the second design pattern B11 is not permitted.

When correcting the design pattern, the movement of the design pattern connected to the branch 32 is carried out. In this case, the design layout correcting unit 16 corrects the design pattern based on how much the design patterns can be brought close with respect to the design patterns stretched with the branch 32.

For example, when moving the first design pattern A11, the movement of the first design pattern A1 in a direction of approaching the second design pattern B12 or the second design pattern B14 is permitted. In this case as well, the movement of the first design pattern A11 such that the distance between the first design pattern A11 and the design patterns B12, B14 becomes smaller than the defined minimum value is not permitted.

The correction restriction setting unit 15 of the present embodiment sets the correction guideline based on the branch 31 (defined minimum value between the design patterns) and the branch 32 (distance between the proximity patterns). The correction restriction setting unit 15 sets the region (correction guideline) in which the Hotspot pattern can move based on the design restriction in such manner.

After the first or second mask pattern is corrected, the correction restriction setting unit 15 sets new branches 31, 32 to the first or second mask pattern of after the correction, and sets a new correction guideline based on the set branches 31, 32.

Figure 9:
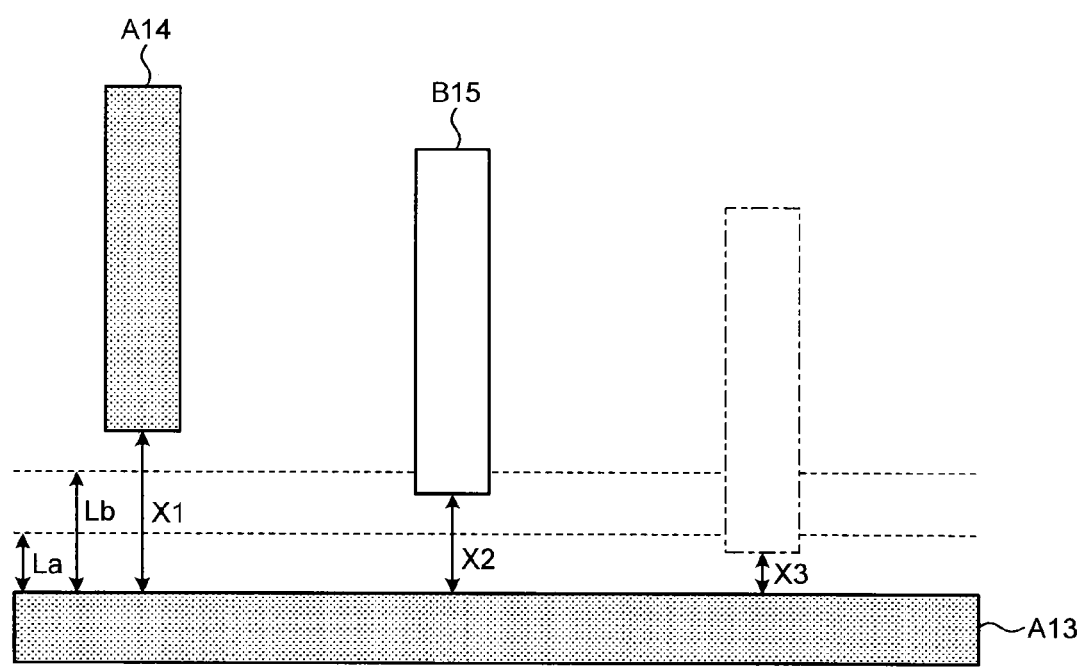
FIG. 9 is a view describing a design restriction of a design pattern.

The design restriction of the design pattern will be described below. FIG. 9 is a view describing a design restriction of a design pattern. In FIG. 9, the top view of the design pattern is illustrated. For example, a case in which the inter-pattern distance (defined minimum value) to be spaced apart between the first mask patterns is an inter-pattern distance Lb, and an inter-pattern distance (defined minimum value) to be spaced apart with respect to between the first mask pattern and the second mask pattern is an inter-pattern distance La will be described. The inter-pattern distances La, Lb are values defined with a design rule, and the like, for example.

Either the first mask pattern or the second mask pattern may be arranged at a position where the inter-pattern distance is spaced apart by Lb or more with respect to the first design pattern A13, which is the first mask pattern. A case in which the first design pattern A14, which is the first mask pattern, is arranged at a position (inter-pattern distance X1) where the inter-pattern distance is spaced apart by Lb or more with respect to the first design pattern A13 is illustrated.

The second mask pattern can be arranged but the first mask pattern cannot be arranged if at the position where the inter-pattern distance is Lb to La with respect to the design pattern A13, which is the first mask pattern. A case in which the second design pattern B15, which is the second mask pattern, is arranged at a position (inter-pattern distance X2) where the inter-pattern distance is Lb to La with respect to the first design pattern A13 is illustrated.

At a position (inter-pattern distance X3) where the inter-pattern distance is shorter than La with respect to the design pattern A13, which is the first mask pattern, neither the first and second mask patterns can be arranged.

Thus, the inter-pattern distance to be spaced apart between the design patterns changes according to the separation attribute of the design pattern. The inter-pattern distance to be spaced apart between the design patterns is defined in the design restriction.

The correction restriction setting unit 15 performs a marker-display, and the like on the design pattern at the display unit 20 to display, in a distinguished manner, a range in which such design patterns can be arranged (moved) and a range in which such design patterns cannot be arranged. The marker display, and the like, are the correction guideline.

The correction restriction setting unit 15 performs, for example, the marker display, and the like on the GDS (layout view). In other words, the correction restriction setting unit 15 displays such that the range, in which the design pattern can be arranged, can be visualized using the GUI.

The correction restriction setting unit 15 may display the branches 31, 32. The correction restriction setting unit 15 may display the Hotspot pattern, the correcting target pattern, the proximity pattern, and the like in a distinguished manner. The correction restriction setting unit 15 may display a recommended movement position of the design pattern.

Figure 10:
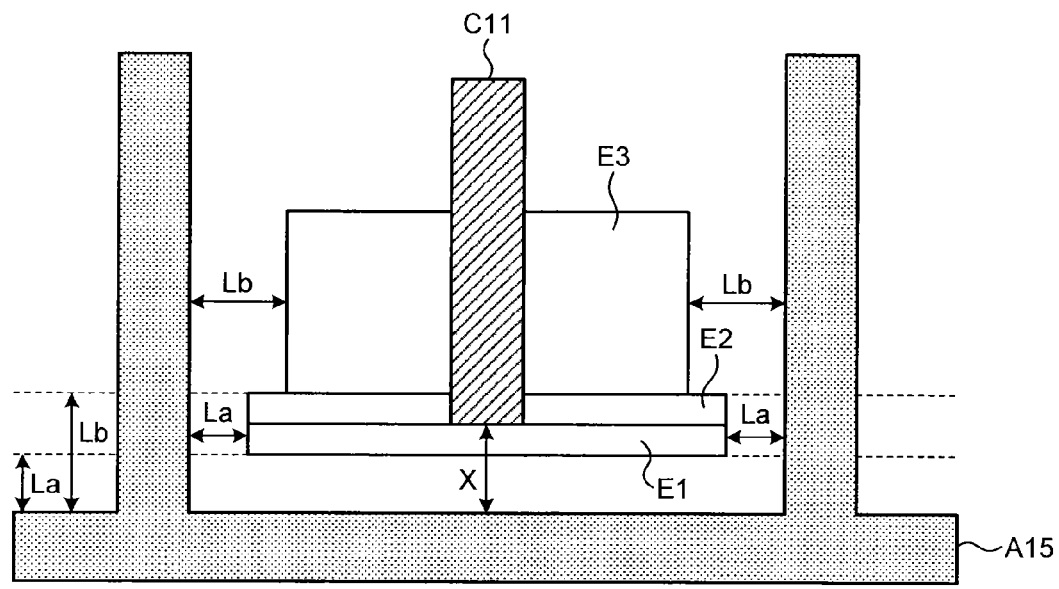
FIG. 10 is a view illustrating one example of a correction guideline.

A specific example of the correction guideline will be described. FIG. 10 is a view illustrating one example of a correction guideline. The correction guideline set when the short error (Hotspot 2) occurs between the design pattern A15 and the design pattern C11 will be described. In the present embodiment, the correction guideline for resolving the Hotspot 2 while suppressing the influence on the dividing attribute (mask division) of the design pattern arranged at the periphery of the Hotspot 2 to a minimum is set.

In FIG. 10, the top view of the design pattern A15 and the design pattern C11 is illustrated. In the design restriction, the defined minimum value with respect to the design patterns having different dividing attributes, the defined minimum value with respect to the design patterns having the same dividing attributes, and the like are set.

For example, if the inter-pattern distance Lb is set for the defined minimum value with respect to the design patterns having the same dividing attribute, the position (region) spaced apart by more than the inter-pattern distance Lb is the region where the Hotspot pattern can be moved between the design patterns having the same dividing attribute.

For example, if the design patterns A15, C11 are both the first mask pattern, the region (movable region E3) in which the design pattern C11, which is the Hotspot pattern, can be moved, becomes the correction guideline with respect to the design pattern C11.

For example, if the inter-pattern distance La is set for the defined minimum value with respect to the design patterns having different dividing attributes, the position (region) spaced apart by more than the inter-pattern distance La is the region where the Hotspot pattern can be moved between the design patterns having different dividing attributes.

For example, if the design pattern A15 is the first mask pattern and the design pattern C11 is the second mask pattern, the region (movable regions E1, E2) in which the design pattern C11, which is the Hotspot pattern, can be moved, becomes the correction guideline with respect to the design pattern C11.

If the design patterns A15, C11 before the correction are both the first mask pattern, the distal end of the design pattern C11 can be moved to any position in the movable region E1 to E3 by changing the design pattern C11 to the second mask pattern.

If the design patterns A15, C11 before the correction are both the first mask pattern, the distal end of the design pattern C11 can be moved to a position in the movable region E3 by having the design pattern C11 remain as the first mask pattern.

The movable region E2 illustrates a contractable region. The contractable region is a region in which the distal end (end in the longitudinal direction) close to the design pattern A15 of the design pattern C11 can be contracted. The contractable region is arranged in a direction away from the design pattern A15.

The movable region E1 illustrates an extendable region. The extendable region is a region in which the distal end (end in the longitudinal direction) close to the design pattern A15 of the design pattern C11 can be extended. The extendable region is arranged in a direction of approaching the design pattern A15.

The correction restriction setting unit 15 marker-displays the movable regions E1 to E3, and the like so as to be identifiable on the design patterns A15, C11. The correction restriction setting unit 15 marker-displays the movable regions E1 to E3, for example, with different colors. The correction restriction setting unit 15 may text display the movable regions E1 to E3. In this case, the correction restriction setting unit 15 displays the coordinate values, and the like of the movable regions E1 to E3.

Thus, the correction restriction setting unit 15 sets the movable regions E1, E2 that can be set to the design pattern C11 as the correction guidelines when not changing the dividing attribute of the design pattern C11 (Hotspot pattern). When changing the dividing attribute of the design pattern C11, the correction restriction setting unit 15 sets the movable regions E1 to E3 that can be set to the design pattern C11 as the correction guidelines.

A case of setting the correction guideline with respect to the design pattern C11 has been described, but the correction restriction setting unit 15 may set the correction guideline with respect to the design pattern A15.

The correction of the first or second mask pattern by the mask data creating system 100 is carried out for each layer of the wafer process, for example. A semiconductor device (semiconductor integrated circuit) is manufactured using the corrected first and second mask patterns, as necessary.

Specifically, the mask pattern is generated using the corrected first and second mask patterns, and the mask is produced using the mask patterns. The exposure using the mask is carried out on a substrate (wafer) applied with a resist, and thereafter, the substrate is developed and a resist pattern is formed on the substrate.

For example, when the double patterning is the LELE process, the desired pattern is generated by repeating the steps of lithography and etching for two times. In other words, after the first resist is applied on the substrate, the first exposure process is carried out using the first mask corresponding to the first mask pattern. The first developing process and the first etching process are then carried out on the substrate.

Thereafter, the second resist is applied on the substrate, and the second exposure process is carried out using the second mask corresponding to the second mask pattern. The second developing process and the second etching process are carried out on the substrate.

An actual pattern corresponding to the first and second mask patterns is thereby formed on the substrate. When manufacturing the semiconductor device, the creation of the first and second mask patterns, the correction process of at least one of the first or second mask pattern, the generation process of the first and second mask patterns, the verification process of the first and second mask patterns, the verification process of the first and second mask patterns, the production process of the mask, the exposure process, the developing process, the etching process, and the like are repeated for each layer.

Figure 11:
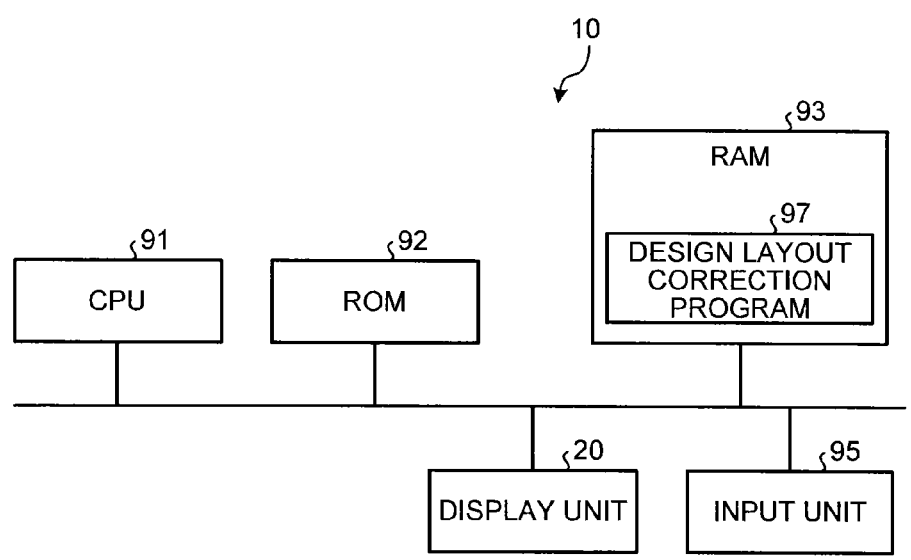
FIG. 11 is a view illustrating a hardware configuration of the layout correcting apparatus.

The hardware configuration of the layout correcting apparatus 10 will now be described. FIG. 11 is a view illustrating a hardware configuration of the layout correcting apparatus 10. The layout correcting apparatus 10 includes a CPU (Central Processing Unit) 91, ROM (Read Only Memory) 92, RAM (Random Access Memory) 93, a display unit 20, and an input unit 95. In the layout correcting apparatus 10, the CPU 91, the ROM 92, the RAM 93, the display unit 20, and the input unit 95 are connected by way of a bus line.

The CPU 91 performs correction of the first or second mask pattern using a design layout correction program 97, which is a computer program. The design layout correction program 97 is a computer program product including a nontransitory computer readable recording medium including a plurality of commands for correcting a first or second mask pattern executable in a computer. In the design layout correction program 97, the plurality of commands cause the computer to correct the first or second mask pattern.

The display unit 20 is a display device such as a liquid crystal monitor, and the like, and displays the first and second mask patterns, and the like based on the instruction from the CPU 91. The input unit 95 is configured to include a mouse and a keyboard, and inputs instruction information (parameter necessary for correction of the first or second mask pattern, etc.) externally input from the user. The instruction information input to the input unit 95 is transmitted to the CPU 91.

The design layout correction program 97 is stored in the ROM 92, and is loaded to the RAM 93 through the bus line. In FIG. 11, a state in which the design layout correction program 97 is loaded to the RAM 93 is illustrated.

The CPU 91 executes the design layout correction program 97 loaded in the RAM 93. Specifically, in the layout correcting apparatus 10, the CPU 91 reads out the design layout correction program 97 from the ROM 92, develops the same in a program storage region in the RAM 93, and executes various types of processes in accordance with the instruction input from the input unit 95 (instruction input unit 11Y) by the user. The CPU 91 temporarily stores various types of data generated in the various types of processes in the data storage region formed in the RAM 93.

The design layout correction program 97 executed by the layout correction apparatus 10 has a module configuration including the correcting target region setting unit 12, the proximity pattern region setting unit 13, the verifying region setting unit 14, the correction restriction setting unit 15, and the design layout correcting unit 16, which are loaded on the main storage device and generated on the main storage device.

In the present embodiment, a case in which the design layout 21 is divided into two has been described, but the design layout 21 may be divided into three or more. In the present embodiment, there is no limitation in spreading the space between the design patterns, but the distance of spreading the space between the design patterns is limited when taking into consideration the region for covering the contact hole, via, and the like.

Thus, in the embodiment, the correcting target region 3 corresponding to the arrangement position of the correcting target pattern and the verifying region corresponding to the correcting target region 3 are set, the correcting target pattern is corrected within the correcting target region 3, and whether or not the first and second mask patterns are in the desired design layout is verified within the verifying region.

Thus, according to the embodiment, the correcting target region 3 with respect to the design pattern can be limited, so that the first or second mask pattern can be corrected easily and in a short time. The region (other than the verifying region) not influenced by the correction of the first or second mask pattern does not need re-execution of the dividing process, OPC, LCC, and the like. Thus, the first or second mask pattern to be used in the multiple patterning can be corrected in a short time while suppressing the occurrence of a new Hotspot. Therefore, the TAT of the mask data creation can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A design layout correcting method implemented by a computer, the method comprising:
   dividing a design layout of a circuit pattern formed in one layer into at least a first mask pattern and a second mask pattern;
   setting a design pattern corresponding to a pattern defect area of the first mask pattern or the second mask pattern as a correcting target pattern when correcting the first mask pattern or the second mask pattern;
   setting a correcting target region corresponding to an arrangement position of the correcting target pattern within the first mask pattern or the second mask pattern;
   setting a verifying region configured to perform verification of the correcting target region within the first mask pattern or the second mask pattern;
   correcting the correcting target pattern within the correcting target region; and
   verifying whether or not the first and second mask patterns are a desired design layout within the verifying region.

2. The design layout correcting method according to claim 1, further comprising:
   setting a correctable range of the correcting target pattern based on a design restriction with respect to the first and second mask patterns; and
   correcting the correcting target pattern within the correctable range.

3. The design layout correcting method according to claim 2, further comprising:
   displaying the correcting target pattern and the correctable range as a correction guideline; and
   correcting the correcting target pattern in accordance with a user instruction along the correction guideline.

4. The design layout correcting method according to claim 3, wherein
   the correction guideline is displayed with marker or text.

5. The design layout correcting method according to claim 1, further comprising:
   changing at least one of position, shape, and size of the correcting target pattern within the correcting target region when correcting the correcting target pattern.

6. The design layout correcting method according to claim 5, further comprising:

resetting the correcting target region and the verifying region after changing at least one of the position, shape, and size of the correcting target pattern.

7. The design layout correcting method according to claim 5, further comprising:
changing an attribute of at least part of the correcting target pattern after the change from the first mask pattern to the second mask pattern or from the second mask pattern to the first mask pattern, after changing at least one of the position, shape, and size of the correcting target pattern.

8. The design layout correcting method according to claim 1, further comprising:
changing an attribute of at least part of the correcting target pattern from the first mask pattern to the second mask pattern or from the second mask pattern to the first mask pattern when correcting the correcting target pattern.

9. The design layout correcting method according to claim 1, further comprising:
redividing the design layout into a new first mask pattern and a new second mask pattern within the correcting target region when correcting the correcting target pattern.

10. The design layout correcting method according to claim 9, wherein
the redividing process is carried out after changing at least one of the position, shape, and size of the correcting target pattern.

11. The design layout correcting method according to claim 1, further comprising:
resetting a correcting target region with respect to the correcting target pattern after a change by broadening the correcting target region; and
correcting the correcting target pattern of after the change is corrected within the reset correcting target region.

12. The design layout correcting method according to claim 1, wherein
the correcting target pattern is a design pattern arranged at an arrangement interval of a defined minimum value with respect to the design pattern of the pattern defect area.

13. The design layout correcting method according to claim 1, wherein
when correcting the first mask pattern or the second mask pattern, an unlock pattern arranged within a predetermined range from the correcting target pattern and permitted to be corrected as necessary is further set; and
the unlock pattern is corrected when correcting the correcting target pattern within the correcting target region.

14. The design layout correcting method according to claim 13, wherein
a lock pattern arranged at a position closest from the unlock pattern and taken into consideration when correcting the unlock pattern is further set; and
the unlock pattern is corrected so that patterns between the unlock pattern and the lock pattern do not violate a design restriction.

15. The design layout correcting method according to claim 14, wherein
the verifying region includes the unlock pattern and the lock pattern.

16. The design layout correcting method according to claim 1, wherein
the verifying region is set based on an optical radius set based on an exposure condition of, when performing an exposure on a substrate, using a first mask corresponding to the first mask pattern or a second mask corresponding to the second mask pattern.

17. The design layout correcting method according to claim 1, wherein
the first and second mask patterns are used for Litho-Etch-Litho-Etch process, Litho-Litho-Etch process, or Litho-Freeze-Litho-Etch process.

18. A nontransitory computer readable recording medium recorded with a design layout correction program for causing a computer to correct a design layout of a circuit pattern formed in one layer, the recording medium recorded with the design layout correction program for causing the computer to perform the following functions:
setting a design pattern corresponding to a pattern defect area of a first mask pattern or a second mask pattern as a correcting target pattern when correcting at least one of the first mask pattern or the second mask pattern divided from the design layout;
setting a correcting target region corresponding to an arrangement position of the correcting target pattern within the first mask pattern or the second mask pattern; and
correcting the correcting target pattern within the correcting target region.

19. The nontransitory computer readable recording medium according to claim 18, further comprising the following functions:
setting a correctable range of the correcting target pattern based on a design restriction with respect to the first mask pattern and the second mask pattern; and
correcting the correcting target pattern within the correctable range.

20. A design layout correcting apparatus comprising:
a correcting target region setting unit configured to set a correcting target pattern, which is a design pattern corresponding to a pattern defect area, of a first mask pattern or a second mask pattern as a correcting target pattern, and setting a correcting target region corresponding to an arrangement position of the correcting target pattern within the first mask pattern or the second mask pattern when correcting at least one of the first mask pattern and the second mask pattern divided from a design layout of a circuit pattern formed in one layer; and
a design layout correcting unit configured to correct the correcting target pattern within the correcting target region.

* * * * *